United States Patent
Oda

(10) Patent No.: US 10,256,588 B2
(45) Date of Patent: Apr. 9, 2019

(54) ELECTRIC CONTACT AND ELECTRIC COMPONENT SOCKET

(71) Applicant: ENPLAS CORPORATION, Kawaguchi-shi, Saitama (JP)

(72) Inventor: Takahiro Oda, Kawaguchi (JP)

(73) Assignee: ENPLAS CORPORATION, Kawaguchi (JP)

( * ) Notice: Subject to any disclaimer, the term of this patent is extended or adjusted under 35 U.S.C. 154(b) by 0 days.

(21) Appl. No.: 15/563,297

(22) PCT Filed: Mar. 22, 2016

(86) PCT No.: PCT/JP2016/058978
§ 371 (c)(1),
(2) Date: Sep. 29, 2017

(87) PCT Pub. No.: WO2016/158568
PCT Pub. Date: Oct. 6, 2016

(65) Prior Publication Data
US 2018/0076590 A1    Mar. 15, 2018

(30) Foreign Application Priority Data

Mar. 31, 2015  (JP) ................... 2015-071626
Mar. 31, 2015  (JP) ................... 2015-071628
Mar. 31, 2015  (JP) ................... 2015-071630

(51) Int. Cl.
*H01R 12/00*    (2006.01)
*H01R 33/76*    (2006.01)
(Continued)

(52) U.S. Cl.
CPC ............. *H01R 33/76* (2013.01); *G01R 1/067* (2013.01); *G01R 1/06722* (2013.01);
(Continued)

(58) Field of Classification Search
CPC .......... H01R 33/76; H01R 4/02; H01R 12/88; H01R 13/02; H01R 13/03; H01R 13/2435;
(Continued)

(56) References Cited

U.S. PATENT DOCUMENTS 5,243,757 A * 9/1993 Grabbe ................ H01R 13/03
                                                                  29/874
5,248,262 A * 9/1993 Busacco .............. H05K 7/1069
                                                                  439/493
(Continued)

FOREIGN PATENT DOCUMENTS

JP    H10255930 A    9/1998
JP    3206922 B      7/2001
(Continued)

OTHER PUBLICATIONS

International Search Report; Form PCT/ISA/210; dated Jun. 21, 2016 in corresponding PCT Application No. PCT/JP2016/058978 (3 pages) (2 pages English Translation).
(Continued)

*Primary Examiner* — Jean F Duverne
(74) *Attorney, Agent, or Firm* — Staas & Halsey LLP

(57) ABSTRACT

An electric contact having a contact resistance that is hardly increased even if the electric contact is repeatedly used for a long period of time. A base material of an electric contact is provided with a first contact part that is in contact with a first electrode of a first electric component, a second contact part that is in contact with a second electrode of a second electric component, and a spring part that presses the first contact part to the first electrode, and a wear-resistant contact point film is formed on a distal end portion of the first contact part. Furthermore, a highly conductive film is formed between a region of the wear-resistant contact point
(Continued)

film and a distal end portion of the second contact part in the base material.

19 Claims, 8 Drawing Sheets

(51) Int. Cl.
| | |
|---|---|
| *G01R 1/067* | (2006.01) |
| *G01R 1/073* | (2006.01) |
| *G01R 31/26* | (2014.01) |
| *H01R 12/57* | (2011.01) |
| *H01R 12/88* | (2011.01) |
| *H01R 13/03* | (2006.01) |
| *H01R 13/24* | (2006.01) |

(52) U.S. Cl.
CPC .............. *G01R 1/073* (2013.01); *G01R 31/26* (2013.01); *H01R 12/57* (2013.01); *H01R 12/88* (2013.01); *H01R 13/03* (2013.01); *H01R 13/2435* (2013.01); *H01R 13/24* (2013.01)

(58) Field of Classification Search
CPC ........ H01R 12/57; H01R 13/24; G01R 1/067; G01R 1/048; G01R 31/26; G01R 1/073; G01R 1/06722; H05K 7/1069
USPC .......................................................... 439/71
See application file for complete search history.

(56) References Cited

U.S. PATENT DOCUMENTS

| | | | | |
|---|---|---|---|---|
| 5,611,705 A * | 3/1997 | Pfaff | .................... | G01R 1/0483 439/266 |
| 5,829,988 A * | 11/1998 | McMillan | ............ | H05K 7/1069 439/70 |
| 6,832,918 B2 * | 12/2004 | Hou | ......................... | H01R 4/02 439/330 |
| 7,306,024 B2 * | 12/2007 | Beals | ........................ | B22C 7/02 164/361 |
| 2002/0182919 A1 * | 12/2002 | Watanabe | .............. | H01R 12/88 439/342 |
| 2010/0025096 A1 | 2/2010 | Nikaido et al. | | |

FOREIGN PATENT DOCUMENTS

| | | |
|---|---|---|
| JP | 2002-359047 A | 12/2002 |
| JP | 2003-142189 A | 5/2003 |
| JP | 2010-40253 A | 2/2010 |
| JP | 4916719 B2 | 4/2012 |
| WO | WO 98/11449 | 3/1998 |
| WO | WO 2016/158568 A1 | 10/2016 |

OTHER PUBLICATIONS

Form PCT/ISA/237; dated Jun. 21, 2016 in corresponding PCT Application No. PCT/JP2016/058978 (6 pages).
Notification of Receipt of Record Copy; Form PCT/IB/301; mailed Apr. 12, 2016 in corresponding PCT Application No. PCT/JP2016/058978 (1 page).
Notification Concerning Submission of Priority Document; Form PCT/IB/304; mailed May 3, 2016 (1 page).

* cited by examiner

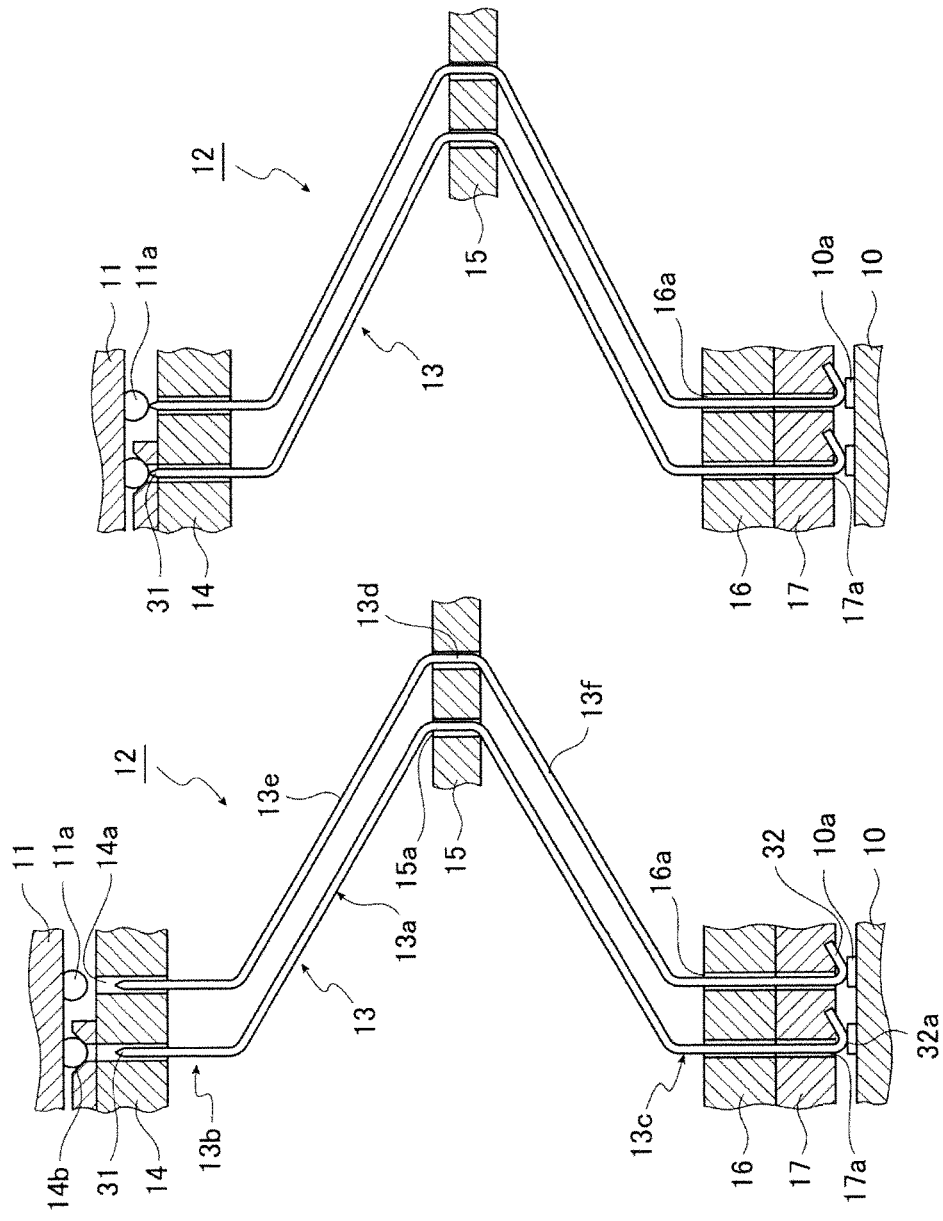

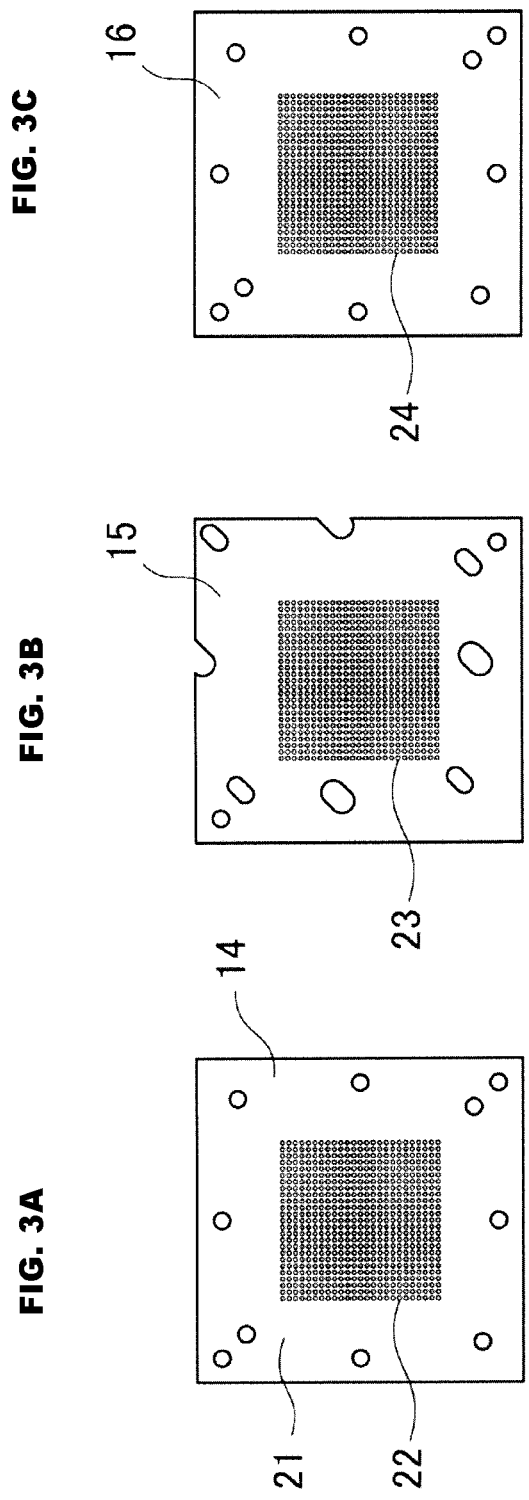

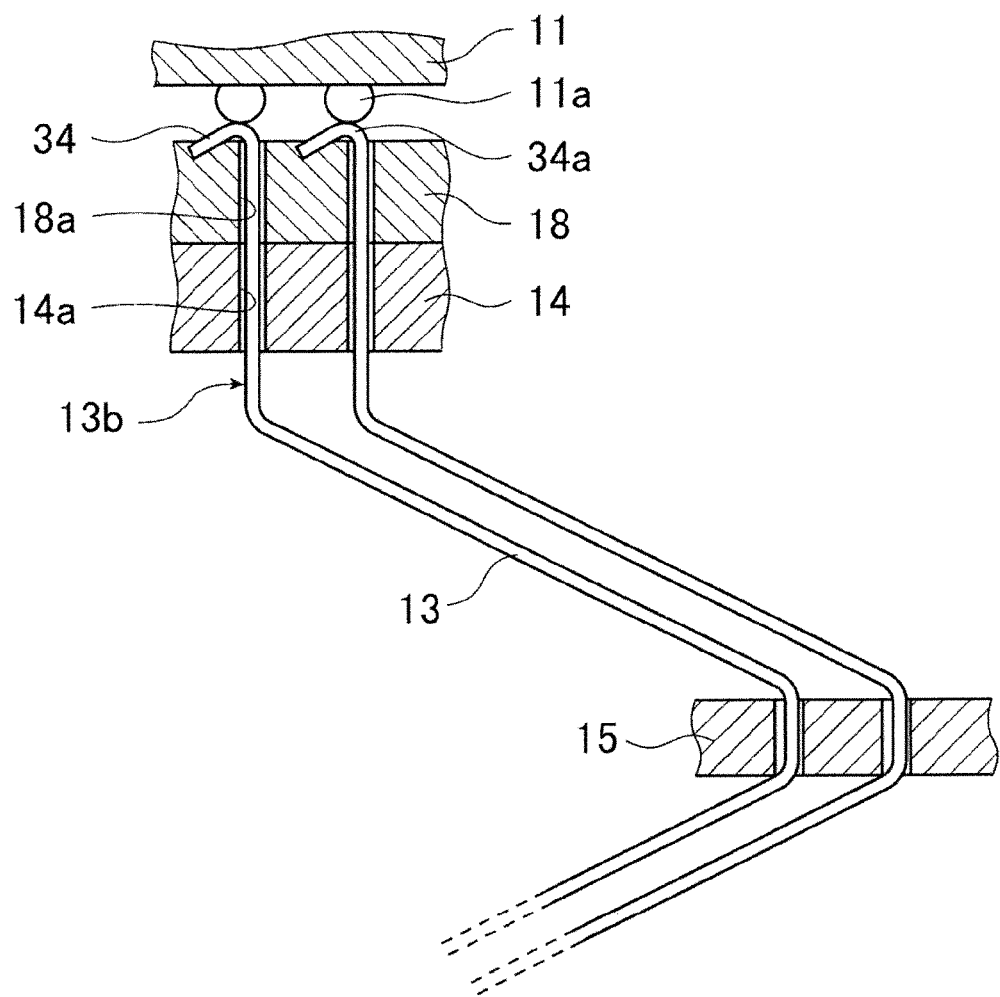

ELECTRIC CONTACT AND ELECTRIC COMPONENT SOCKET

CROSS-REFERENCE TO RELATED APPLICATIONS

This application is a U.S. National Stage Application, which claims the benefit under 35 U.S.C. § 371 of International Patent Application No. PCT/JP2016/058978, filed Mar. 22, 2016, which claims the foreign priority benefit under 35 U.S.C. § 119 of Japanese Patent Application No. 2015-071626, filed Mar. 31, 2015, Japanese Patent Application No. 2015-071628, filed Mar. 31, 2015, and Japanese Patent Application No. 2015-071630, filed Mar. 31, 2015, the contents of which are incorporated herein by reference.

TECHNICAL FIELD

The present invention relates to an electric contact that electrically connects a first electric component such as a semiconductor device (e.g., an "IC package") to a second electric component such as a wiring board, and an IC socket using the electric contact.

BACKGROUND ART

There has been conventionally known such electric component sockets (hereinafter referred to as "IC sockets") as disclosed, for example, in Japanese Patent No. 3206922 and Japanese Patent No. 4916719 described below as this type of electric component socket.

In Japanese Patent No. 3206922, an IC socket is disposed on a wiring board, and houses an IC package therein. A wire probe provided in the IC socket is used to electrically connect an electrode of the wiring board and an electrode of the IC package. The wire probe has ball-shaped contact points formed at both ends thereof, and is embedded in an elastomer material layer in a state being deformed into a predetermined shape.

In Japanese Patent No. 4916719, an IC socket is disposed on a wiring board, and houses an IC package therein. A plurality of contact probes provided in the IC socket are used each to electrically connect an electrode of the wiring board and an electrode of the IC package. These contact probes each include a wire, and plungers provided at both ends of the wire. The lower side plunger is pressed to a connection terminal by a biasing force of the wire, so that the contact probe is electrically connected with the connection terminal of a connection block.

SUMMARY OF INVENTION

Technical Problem

An IC socket is required which is capable of sufficiently ensuring stability and reliability of an electrical connection between a contact part of a wire probe and a terminal of an IC package. However, when the IC socket disclosed in Japanese Patent No. 3206922 is repeatedly used for a long period of time, a distal end of the contact part of the wire probe is worn out, thereby causing a contact area to be increased. As a result, a material for forming the terminal of the IC package is likely to attach to the contact part of the wire probe. Then, an electric resistance of the contact part may be increased which cannot ensure the stability and the reliability of the electrical connection. When the terminal of the IC package is made of lead-free solder alloy (tin), and a number of IC packages are repeatedly subjected to a burn-in test at a high temperature, for example, the distal ends of the contact parts of the wire probes are worn out, thereby causing the contact area to be increased. Thus, the tin is melted to attach to the contact parts of the wire probes and then be alloyed. As a result, the contact resistance between the wire probe and the terminal of the IC package is increased, thereby impairing the reliability of an operation test or the like.

In order to provide the IC socket which is capable of sufficiently ensuring stability and reliability of an electrical connection between a plunger at a lower side of the contact probe and the connection terminal of the connection block, it is desirable to bring the plunger into contact with the connection terminal by a proper pressing force. However, in the IC socket disclosed in Japanese Patent No. 4916719, the biasing force of the wire is used to press the lower side plunger to the connection terminal, and therefore if the biasing force is weak, the connection terminal cannot be in contact with a hard electrode such as a gold pad by a proper load. When a preload is applied to stabilize the contact, an upper side plate is warped which causes non-uniformity in height among the plungers. As a result, a contact failure with respect to an object to be inspected may occur, or the plungers cannot be uniformly pressed to each connection terminal of the connection block by a proper pressing force.

Furthermore, in the IC socket disclosed in Japanese Patent No. 3206922, a ball-shaped contact point is previously formed at each of the lower ends of the wire probes, and the ball-shaped contact points at the lower ends of the wire probes are individually adhered to the wiring board. The upper ends of the wire probes are required to be cut each to form a ball-shaped contact point. Accordingly, the IC socket disclosed in Japanese Patent No. 3206922 has disadvantages of a complicated manufacturing process and a high manufacturing cost. On the other hand, the IC socket disclosed in Japanese Patent No. 4916719 has disadvantages of a complicated structure of the contact probe and a high manufacturing cost.

An object of the present invention is to provide an electric component socket having excellent reliability and stability of the connection between a semiconductor device and a wiring board, or the like at a low cost.

Solution to Problem

An electric contact according to a first aspect of the present invention that electrically connects a first electrode provided in a first electric component and a second electrode provided in a second electric component, includes: a base material that has a first contact part that is in contact with the first electrode of the first electric component, a second contact part that is in contact with the second electrode of the second electric component, and a spring part that brings the first contact part into contact with the first electrode of the first electric component by a predetermined contact pressure; a wear-resistant contact point film that is formed on at least a distal end portion of the first contact part of the base material and has a higher wear resistance than the base material; and a highly conductive film that is formed between a distal end portion of the second contact part and a region where the wear-resistant contact point film is formed in the base material and has a smaller electric resistance than the base material.

In the electric contact according to the first aspect of the present invention, it is desirable to form a spherical surface having a radius of 2 μm or more and 10 μm or less in the distal end portion of the first contact part, and form the wear-resistant contact point film on at least the spherical surface.

In the electric contact according to the first aspect of the present invention, it is desirable for the predetermined contact pressure to be 5 grams or less.

In the electric contact according to the first aspect of the present invention, it is desirable for the wear-resistant contact point film to be chemically inactive.

In the electric contact according to the first aspect of the present invention, it is desirable for the wear-resistant contact point film to be a carbon film, or a ruthenium film, an iridium film, a gold film, a silver film, a palladium film, a rhodium film, or an alloy film of these metals.

In the electric contact according to the first aspect of the present invention, it is desirable for the highly conductive film to be a silver film, a gold film, or copper-nickel laminated film.

An electric component socket according to a second aspect of the present invention is configured to electrically connect the first electrode provided in the first electric component and the second electrode provided in the second electric component using the electric contact according to the first aspect.

An electric component socket according to a third aspect of the present invention includes: a plate; a plurality of electric contacts each of which has a contact part that is inserted into a corresponding plate insertion hole of the plate, and is in contact with an electrode of an electric component; and an elastomer sheet that is provided to the plate so as to face the electrode of the electric component, the elastomer sheet having sheet insertion holes each for inserting the electric contact therethrough, the electric contact including a pressure receiving portion that receives a pressing force of the elastomer sheet to bring the contact part into contact with the electrode of the electric component at a predetermined contact pressure, and the elastomer sheet being elastically deformed to press the pressure receiving portion so that the electric contact is in contact with the electrode of the electric component by the pressing force.

An electric component socket according to a fourth aspect of the present invention includes: a first plate that houses a first electric component; a second plate that is disposed to face a second electric component; and a plurality of electric contacts each of which includes: a first contact part that is inserted into a first insertion hole in the first plate to be in contact with a first electrode of the first electric component; a second contact part that is inserted into a second insertion hole in the second plate to be in contact with a second electrode of the second electric component; and a spring part that brings the first contact part into contact with the first electrode of the first electric component, the first contact part of the electric contact being in contact with the first electrode of the first electric component by a contact pressure generated by the spring part, the second plate including an elastomer sheet provided to face the second electrode of the second electric component, the elastomer sheet having sheet insertion holes each for inserting the electric contact therethrough, the electric contact including a pressure receiving portion that receives a pressing force of the elastomer sheet to bring the second contact part into contact with the electrode of the electric component at a predetermined contact pressure, and the elastomer sheet being elastically deformed to press the pressure receiving portion so that the electric contact is in contact with the electrode of the electric component by the pressing force.

In each of the electric component sockets according to the third and fourth aspects of the present invention, it is desirable for the pressure receiving portion to be an L-shaped contact point formed by bending a distal end portion of the electric contact.

An electric component socket according to a fifth aspect of the present invention includes; a plate; and an electric contact that is provided with a contact part that is inserted into a plate insertion hole of the plate, and is in contact with an electrode of an electric component, the contact part of the electric contact having an L-shaped contact point formed by bending a distal end portion of the contact part so that a bent portion of the L-shaped contact point being in contact with the electrode of the electric component.

An electric component socket according to a sixth aspect of the present invention includes: a first plate that houses a first electric component; a second plate that is disposed to face a second electric component; and an electric contact that includes: a first contact part that is inserted into a first insertion hole in the first plate to be in contact with a first electrode of the first electric component; a second contact part that is inserted into a second insertion hole in the second plate to be in contact with a second electrode of the second electric component; and a spring part that is provided between the first contact part and the second contact part, the first contact part of the electric contact being in contact with the first electrode of the first electric component by a contact pressure generated by the spring part, and the second contact part of the electric contact including an L-shaped contact point formed by bending a distal end portion of the second contact part in a substantially L-shape so that a bent portion of the L-shaped contact point is in contact with the second electrode of the second electric component by being pressed by a contact pressure generated by the spring part.

An electric component socket according to a seventh aspect of the present invention includes: a first plate that houses a first electric component; a second plate that is disposed to face a second electric component; and an electric contact that includes: a first contact part that is inserted into a first insertion hole in the first plate to be in contact with a first electrode of the first electric component; a second contact part that is inserted into a second insertion hole in the second plate to be in contact with a second electrode of the second electric component; and a spring part that is provided between the first contact part and the second contact part, the first contact part of the electric contact being in contact with the first electrode of the first electric component by a contact pressure generated by the spring part, and the second contact part of the electric contact including an L-shaped contact point formed by bending a distal end portion of the second contact part in a substantially L-shape so that a bent portion of the L-shaped contact point is in contact with the second electrode of the second electric component by being pressed by a pressing force of the second plate.

In each of the electric component sockets according to the fifth, sixth and seventh aspects of the present invention, it is desirable to provide the electric contact in which a conductive surface film is formed on a springy wire material, at least one end of the springy wire material is cut, and then the L-shaped contact point is formed by bending the cut end in a substantially L-shape.

Advantageous Effects of Invention

According to the electric contact according to the first aspect of the present invention, the wear-resistant contact point film is formed on the distal end portion of the first contact part, thereby preventing a contact area from being increased due to wear of the distal end portion. Even if the electric contact is repeatedly used for a long period of time, the electric resistance can be maintained in a sufficiently low state.

In the electric contact according to the first aspect of the present invention, a spherical surface having a radius of 2 µm or more and 10 µm or less is formed at the distal end portion of the first contact part, so that a material for forming a first terminal can hardly remain on the first contact part, and the wear-resistant contact point film can be hardly peeled off from the spherical surface. Accordingly, even if the electric contact is repeatedly used for a long period of time, the electric resistance can be easily maintained in a sufficiently low state.

In the electric contact according to the first aspect of the present invention, a contact pressure between the electric contact and the first electric component is set to 5 grams or less, so that the spherical surface of the electric contact can be hardly worn out. Then, the contact area between the spherical surface and the first electric component can be prevented from being increased, thereby capable of ensuring a sufficiently low contact resistance.

In the electric contact according to the first aspect of the present invention, a chemically inactive film is used as the wear-resistant contact point film, thereby capable of obtaining the wear-resistant contact point film that is hardly alloyed with the material for forming the first electrode provided in the first electric component.

In the electric contact according to the first aspect of the present invention, a carbon film, or a ruthenium film, an iridium film, a gold film, a silver film, a palladium film, a rhodium film, or an alloy film of these metals is used as the wear-resistant contact point film, thereby capable of obtaining the wear-resistant contact point film that is hardly alloyed with the material for forming the first electrode provided in the first electric component and is hardly worn out.

In the electric contact according to the first aspect of the present invention, a silver film, a gold film, or copper-nickel laminated film is used as the highly conductive film, thereby capable of sufficiently lowering the electric resistance of the electric contact.

According to the electric component socket according to the second aspect of the present invention, the electric contact according to the first aspect is used, thereby capable of obtaining the electric component socket that does not impair the stability and the reliability even if the electric contact is repeatedly used for a long period of time.

According to the electric component socket according to the third aspect of the present invention, the pressure receiving portion of the electric contact is pressed by a stress caused when the elastomer sheet is elastically deformed, and the electric contact is brought into contact with the electrode of the electric component by the pressing force received by the pressure receiving portion, so that each electric contact can be brought into contact with the electrode of the electric component by the uniform pressing force. Accordingly, these pressing forces can be easily set to respective proper values.

According to the electric component socket according to the fourth aspect of the present invention, the pressure receiving portion of the electric contact is pressed by a stress caused when the elastomer sheet is elastically deformed, and the electric contact is brought into contact with the second electrode of the second electric component by the pressing force received by the pressure receiving portion, so that each electric contact can be brought into contact with the electrode of the second electric component by the uniform pressing force. Accordingly, these pressing forces can be easily set to respective proper values. In addition, the first contact part is brought into contact with the first electrode of the first electric component by a biasing force generated by each electric contact, so that the pressing force of the first contact part can be set independently of that of the second contact part.

In each of the electric component sockets according to the third and fourth aspects of the present invention, the pressure receiving portion is formed by bending the distal end portion of the second contact part, thereby capable of easily forming the pressure receiving portion.

According to the electric component socket according to the fifth aspect of the present invention, the L-shaped contact point formed by bending the distal end portion of the electric contact is used as the contact part of the electric contact, and therefore a manufacturing process becomes simple. Accordingly, the electric component socket can be provided at a low cost.

According to each of the electric component sockets according to the sixth and seventh aspects of the present invention, the L-shaped contact point formed by bending the distal end portion of the electric contact in a substantially L-shape is used as the second contact part of the electric contact, and therefore a manufacturing process becomes simple. Accordingly, the electric component socket can be provided at a low cost.

In each of the electric component sockets according to the fifth, sixth and seventh aspects of the present invention, the conductive surface film is formed on the springy wire material, at least one end of the springy wire material is cut, and then the L-shaped contact point of the electric contact is formed by bending the cut end in a substantially L-shape, and therefore a manufacturing process becomes simple. Accordingly, the electric component socket can be provided at a low cost.

BRIEF DESCRIPTION OF DRAWINGS

FIG. 1A is a plan view, and FIG. 1B is a cross-sectional view taken along line A-A.

FIGS. 2A-2B are cross-sectional views each schematically illustrating a main portion configuration of the IC socket according to Embodiment 1 of the present invention, where FIG. 2A illustrates a state where an IC package is not housed in the IC socket, and FIG. 2B illustrates a state where the IC package is housed in the IC socket.

FIGS. 3A-3C are cross-sectional views each schematically illustrating a main portion configuration of the IC socket according to Embodiment 1 of the present invention, where FIG. 3A illustrates an upper side plate, FIG. 3B illustrates an intermediate plate, and FIG. 3C illustrates a lower side plate.

FIG. 4A illustrates a first contact part, and FIG. 4B illustrates a second contact part.

FIG. 7A is a plan view, and FIG. 7B is a cross-sectional view.

FIG. 8 is a cross-sectional view schematically illustrating a configuration of an IC socket according to Embodiment 2 of the present invention.

DESCRIPTION OF EMBODIMENTS

Figure 1A:
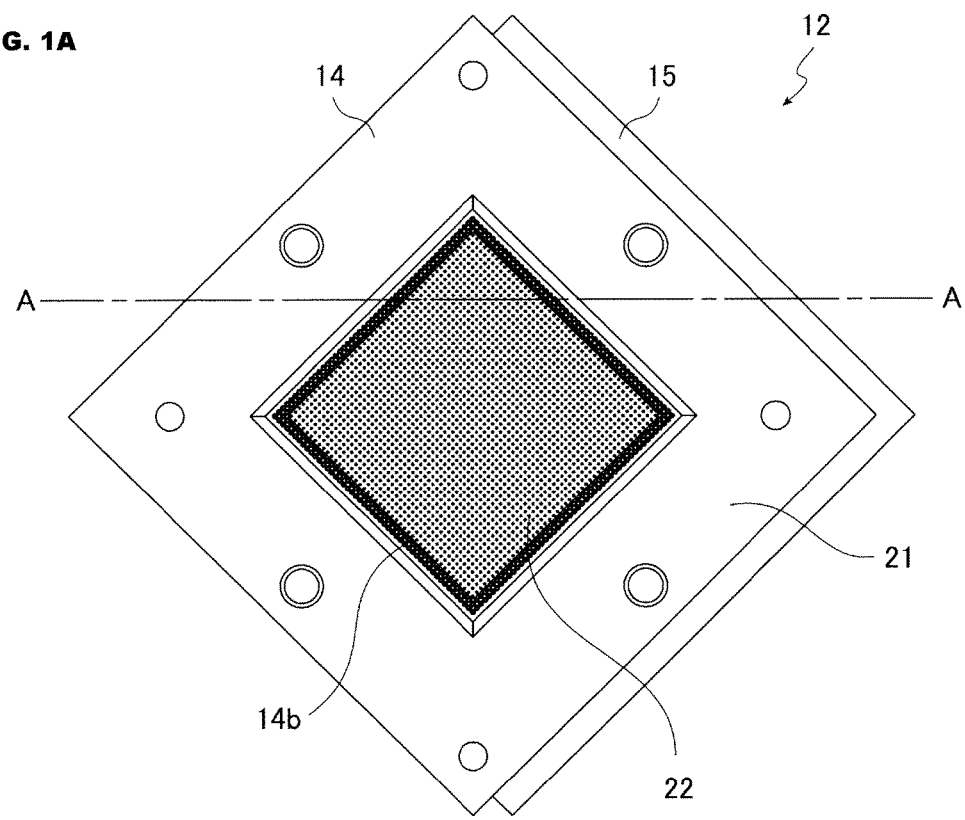
FIGS. 1A-1B are cross-sectional views each schematically illustrating a configuration of an IC socket according to Embodiment 1 of the present invention, where

Embodiments of the present invention are described below.

[Embodiment 1 of Invention]

In the present embodiment, an IC socket 12 as an "electric component socket" is disposed on a wiring board 10 as a "second electric component," and houses an IC package 11 as a "first electric component," as illustrated in FIGS. 1A-1B and FIGS. 2A-2B. A solder ball 11a as a "first electrode" of the IC package 11 is electrically connected with an electrode 10a as a "second electrode" of the wiring board 10 through the IC socket 12.

The IC socket 12 includes: a plurality of wire probes 13 as "electric contacts"; an upper side plate 14 as a "first plate"; an intermediate plate 15; a lower side plate 16 as a "second plate"; and an elastomer sheet 17.

The wire probe 13 is an electric contact that electrically connects the solder ball 11a of the IC package 11 and the electrode 10a of the wiring board 10, and is formed by plastically deforming one wire material (to be described later). The wire probes 13 are disposed in the IC socket 12 along a vertical direction, in, e.g., a matrix form.

FIGS. 2A-2B each illustrate only two of the plurality of wire probes 13. As illustrated FIGS. 2A-2B, the wire probe 13 includes: a spring part 13a; a first contact part 13b that extends upwardly from the spring part 13a; and a second contact part 13c that extends downwardly from the spring part 13a.

The spring part 13a includes: a middle portion 13d that is inserted into an insertion hole 15a in the intermediate plate 15; a first spring region 13e that extends to be inclined upwardly from the middle portion 13d (i.e., in a direction approaching the upper side plate 14); and a second spring region 13f that extends to be inclined downwardly from the middle portion 13d (i.e., in a direction approaching the lower side plate 16). As a result, the spring part 13a is formed in a substantially "V"-shape (or may be formed in a substantially "U"-shape). Forming the spring part 13a in a V-shape or a U-shape enables variation of the biasing force caused by the deformation of the spring part 13a (vertical movement of the first contact part 13b) to be extremely reduced.

Figure 4A:
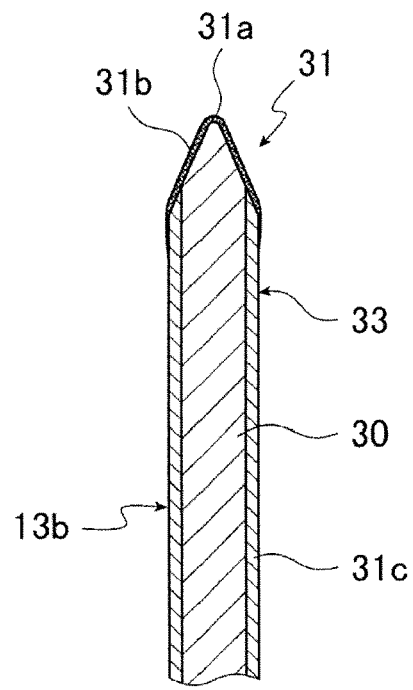
FIGS. 4A-4B are cross-sectional views each schematically illustrating a wire probe according to Embodiment 1 of the present invention, where

The first contact part 13b is inserted into an insertion hole 14a in the upper side plate 14. The first contact part 13b is provided with a substantially conical-shaped distal end portion 31 to the distal end of the first contact part 13b as illustrated in an enlarged view of FIG. 4A. Furthermore, the distal end portion 31 has a spherical surface 31a formed thereon, the spherical surface 31a having a radius of 2 μm or more and 10 μm or less (preferably 2 μm or more and 5 μm or less).

A contact area between the first contact part 13b and the solder ball 11a of the IC package 11 can be made sufficiently small by setting the radius of the spherical surface 31a to 10 μm or less, so that the tin which is a material for forming the solder ball 11a can hardly remain on the distal end portion 31 of the first contact part 13b. A wear-resistant contact point film 31b (to be described later) can be formed on the spherical surface 31a in a state of being sufficiently hardly peeled off from the spherical surface 31a by setting the radius of the spherical surface 31a to 2 μm or more. Then, even if the wire probe 13 is repeatedly used for a long period of time, the contact area with the solder ball 11a can be prevented from being increased due to wear of the distal end portion 31.

Figure 4B:
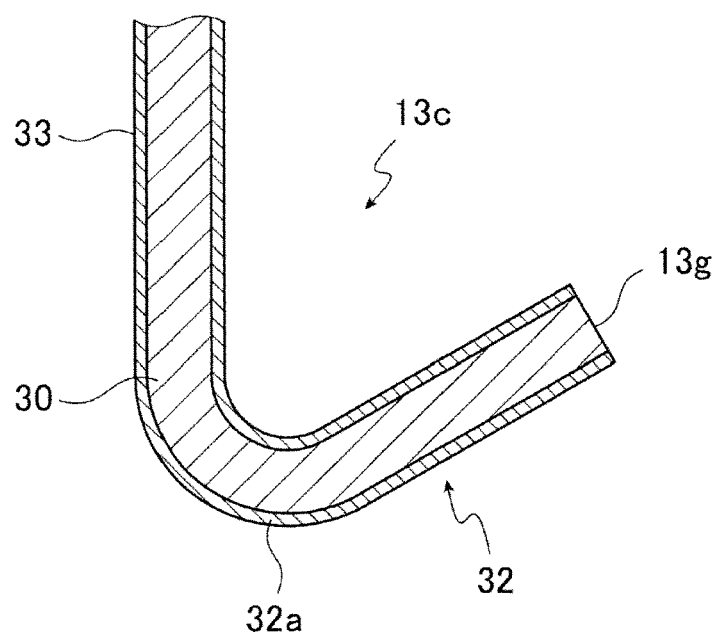

The second contact part 13c is inserted into an insertion hole 16a in the lower side plate 16 and an insertion hole 17a in the elastomer sheet 17 as illustrated in FIGS. 2A-2B. The second contact part 13c has a distal end portion that is bent upwardly by 90 degrees or more to form an L-shaped contact point 32 as illustrated in an enlarged view of FIG. 4B.

The wire probe 13 is made of a springy base material 30 such as stainless steel, piano wire (carbon steel), or tungsten, for example. The base material 30 that can be used has 4 to 12 mm in length and 0.05 to 0.2 mm in diameter.

The conductive wear-resistant contact point film 31b (for example, 0.1 to 3.0 μm in thickness) is formed on the distal end portion 31 of the first contact part 13b of each wire probe 13 by, for example, a film formation method such as CVD (Chemical Vapor Deposition) method, or PVD (Physical Vapor Deposition) method. The wear-resistant contact point film 31b may be formed in a region including at least the spherical surface 31a. By thus forming the wear-resistant contact point film 31b on the spherical surface 31a of the distal end portion 31, the spherical surface 31a can be hardly worn out, thereby preventing the contact area between the first contact part 13b and the solder ball 11a of the IC package 11 from being increased. Examples of the wear-resistant contact point film 31b that can be used include a carbon film, or a ruthenium film, an iridium film, a gold film, a silver film, a palladium film, a rhodium film, or an alloy film of these metals. As compared with the base material 30 of the wire probe 13, the wear-resistant contact point film 31b has a sufficient wear resistance, and if the wear-resistant contact point film 31b is chemically inactive (hardly alloyed) to the solder ball 11a (e.g., tin) of the IC package 11, a film of another material can be used as the wear-resistant contact point film 31b.

On the other hand, a highly conductive film 33 (for example, 5 to 10 μm in thickness) for reducing the electric resistance is formed by, for example, a plating process on at least a surface region 31c between a region for forming the wear-resistant contact point film 31b and a bent portion (distal end portion) 32a of the L-shaped contact point 32 in a surface of each wire probes 13. The highly conductive film 33 can be formed by using, for example, silver, nickel, copper, or the like. If the highly conductive film 33 has an electrical resistance lower than that of the base material 30 of the wire probe 13, a film of another material can be used as the highly conductive film 33. The highly conductive film 33 may have the wear resistance inferior to that of the above-described wear-resistant contact point film 31b, but the highly conductive film 33 having excellent electric conductivity is desirably used. Note that the wear-resistant contact point film 31b and the highly conductive film 33 may be formed of the same material.

Figure 1B:
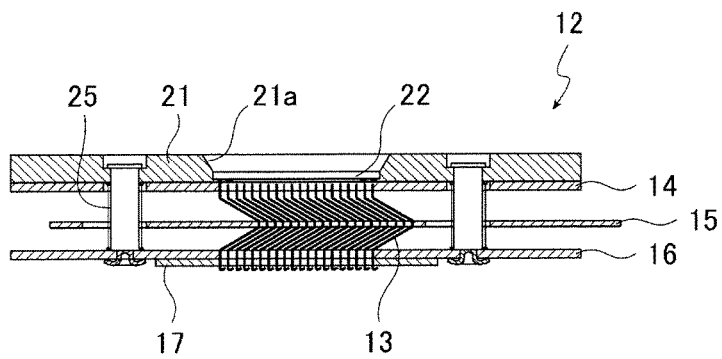

The upper side plate 14 is provided with a housing member 21 for housing the IC package 11 therein on an upper surface side of the upper side plate 14, and a region 22 for disposing the above-described probe is provided in a substantially center portion of the housing member 21, as illustrated FIGS. 1A-1B and FIG. 3A. Note that a guide part 21a for guiding the IC package 11 onto the probe disposing region 22 is provided on the housing member 21. The above-described insertion holes 14a (see FIG. 2A) are formed in the probe disposing region 22. A conical-shaped ball guide 14b is provided on the upper surface of the upper side plate 14 (see FIGS. 1A-1B, and FIG. 2A). The ball guide 14b houses the solder ball 11a therein to position the IC package 11. The ball guides 14b may be provided corresponding to all of the solder balls 11a, may be provided corresponding to only some of the solder balls 11a, or need not be provided.

The upper side plate 14 is provided in the IC socket 12, and is vertically movably supported by support means (not illustrated) in an upwardly biased state. When being pressed downwardly, the upper side plate 14 is guided by guide pins 25 and moved downwardly against the biasing force. When the upper side plate 14 is moved to the highest position, the solder balls 11a of the IC package 11 are separated from the distal end portion 31 of the first contact part 13b provided in the wire probe 13, as illustrated in FIG. 2A. On the other hand, when the IC package 11 is pressed downwardly and the upper side plate 14 is moved downwardly, the solder balls 11a of the IC package 11 each are brought into pressure-contact with the corresponding distal end portion 31 of the first contact part 13b, as illustrated in FIG. 2B. It is then desirable for the contact pressure between the solder ball 11a and the distal end portion 31 to be 5 grams or less. When the contact pressure is set to 5 grams or less, the wear-resistant contact point film 31b formed on the spherical surface 31a of the wire probe 13 can be hardly peeled off and worn out, thereby capable of preventing the contact area between the spherical surface 31a and the solder ball 11a from being increased. Note that as the radius of the spherical surface 31a is 5 µm or less, the contact resistance between the first contact part 13b of the wire probe 13 and the solder ball 11a of the IC package 11 becomes sufficiently low even if the contact pressure is set to 5 grams or less. As described above, forming the spring part 13a in a V-shape or a U-shape enables variation of the biasing force caused by a deformation amount of the spring part 13a (vertical movement amount of the first contact part 13b) to be extremely reduced. Therefore, the contact pressure between the solder ball 11a and the distal end portion 31 can be easily set.

The intermediate plate 15 is provided with a probe disposing region 23 that corresponds to the probe disposing region 22 of the upper side plate 14, as illustrated in FIG. 3B. The above-described insertion holes 15a (see FIG. 2A) are formed in the probe disposing region 23.

The intermediate plate 15 is formed of an insulating material, and is engaged with the bent portion provided in the spring part 13a of each wire probe 13 (here a boundary portion between the middle portion 13d and the second spring region 13f of the wire probe 13).

Providing the intermediate plate 15 can prevent short circuit caused by a contact between wire probes 13.

As the intermediate plate 15 is only engaged with the wire probes 13, the intermediate plate 15 is moved in parallel in a right downward direction illustrated in FIGS. 2A-2B) when the upper side plate 14 is moved downwardly against the biasing force and the solder balls 11a of the IC package 11 each are brought into pressure-contact with the corresponding distal end portion 31 of the wire probes 13 (i.e., when the state of FIG. 2A is changed to the state of FIG. 2B). On the contrary, when the upper side plate 14 is moved upwardly, and the solder balls 11a of the IC package 11 are separated from the distal end portions 31 of the wire probes 13 (i.e., when the state of FIG. 2B is changed to the state of FIG. 2A), the intermediate plate 15 is moved in a left upward direction illustrated in FIGS. 2A-2B). The intermediate plate 15 is thus freely moved in an oblique direction, thereby smoothly enabling the contact and separation between the solder ball 11a and the distal end portion 31 of the wire probe 13 (i.e., upward and downward movements of the upper side plate 14).

Note that the intermediate plate 15 need not to be necessarily positioned at a center between the upper side plate 14 and the lower side plate 16, and may be displaced upwardly or downwardly from the center.

In Embodiment 1, the number of the intermediate plate 15 is one, but may be plural. If a plurality of intermediate plates 15 are used, it is desirable for the wire probe 13 to be formed in a substantially "U" shape.

The lower side plate 16 is provided in the IC socket 12, and is fixed by fixing means (not illustrated). The elastomer sheet 17 is provided on a bottom surface of the lower side plate 16.

The lower side plate 16 is provided with a probe disposing region 24 that corresponds to the probe disposing region 22 of the upper side plate 14, as illustrated in FIG. 3C. The insertion holes 16a (see FIG. 2A) are formed in the probe disposing region 24. The elastomer sheet 17 is provided with insertion holes 17a that correspond to the insertion holes 16a in the lower side plate 16, respectively. As illustrated in FIGS. 2A-2B, the second contact part 13c of the wire probe 13 is inserted into the insertion hole 16a in the lower side plate 16 and the insertion hole 17a in the elastomer sheet 17. The elastomer sheet 17 is elastically deformed when the elastomer sheet 17 is pressed to the lower side plate 16, and the bent portion 32a of the L-shaped contact point 32 is pressed to the wiring board 10 by an elastic reaction force, thus making the second contact part 13c and the electrode 10a conductive.

Note that Embodiment 1 provides a configuration in which the pressing force of the elastomer sheet 17 is received by the L-shaped contact point 32, but the stress caused when the elastomer sheet 17 is elastically deformed may be applied to the second contact part 13c using the other configuration.

However, the L-shaped contact point 32 can be used only by bending the second contact part 13c. Furthermore, using the L-shaped contact point 32 does not require bringing a cutting section 13g of the second contact part 13c into contact with the electrode 10a (see FIG. 4B), and subjecting the cutting section 13g to surface treatment, thereby capable of reducing the manufacturing cost of the wire probe 13.

In Embodiment 1, the contact pressure between the second contact part 13c and the electrode 10a is applied, not by the biasing force of the spring part 13a of the wire probe 13, but by a pressing force of the lower side plate 16. According to Embodiment 1, the contact pressure of each wire probe 13 can be made uniform. Furthermore, the contact pressure can be set to different values between on the first contact part 13b side and on the second contact part 13c side. Accordingly, even if the contact pressure to each of the solder balls 11a of the IC package 11 is made sufficiently small, the reliability of the electrical connection between the wire probe 13 and the electrode 10a of the wiring board 10 is not impaired.

A manufacturing method of the IC socket 12 according to Embodiment 1 is described below.

Figure 5A:
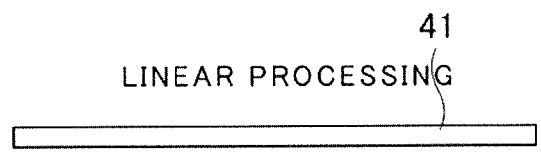
FIGS. 5A-5E are cross-sectional views each schematically illustrating a manufacturing process for the IC socket according to Embodiment 1 of the present invention.

A method of manufacturing a wire for the wire probe 13 is described with reference to FIGS. 5A-5C.

The highly conductive film (for example, silver, nickel, copper, or the like) 33 is formed on the base material 30 of the wire (see FIGS. 4A and 4B) by, for example, plating process. The wire is cut by, for example, 50 mm. Thus, a wire material 41 as a "springy wire material" as illustrated in FIG. 5A is manufactured.

Figure 5B:
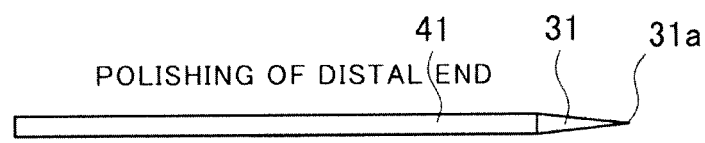
Figure 5C:
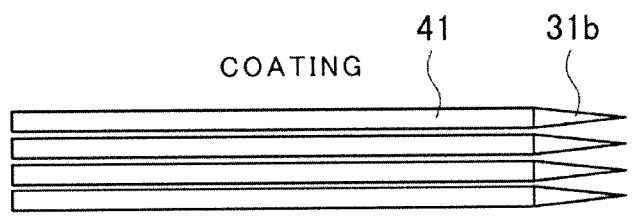

One end of the wire material 41 is polished to form the substantially conical-shaped distal end portion 31 as illustrated in FIG. 5B. The spherical surface 31*a* is formed at a tip of the distal end portion 31, the spherical surface 31*a* having a radius of 2 µm or more and 10 µm or less (preferably, 2 µm or more and 5 µm or less).

The distal end portion 31 of the wire material 41 is coated with carbon film (or ruthenium film, an iridium film, a gold film, a silver film, a palladium film, a rhodium film, or an alloy film of these metals) by, for example, a PVD (Physical Vapor Deposition) method or a CVD (Chemical Vapor Deposition) method. Then, the wear-resistant contact point film 31*b* as illustrated in FIG. 5C is formed.

The wire material 41 is cut to a length used as the wire probe 13 (for example, 6 to 10 mm). Thus, the probe wire 42 as illustrated in FIG. 5D can be obtained.

Figure 5D:
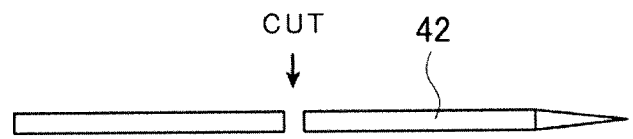
Figure 5E:
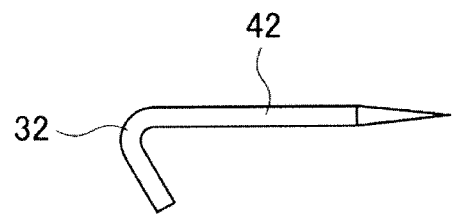

In Embodiment 1, one end of the longer wire material 41 (here a length of about 50 mm) is subjected to a polishing process to easily polish the wire material 41 (see FIG. 5B), the wear-resistant contact point film 31*b* is formed (see FIG. 5C), and then the wire material 41 is cut (see FIG. 5D). However, the wire material 41 may be cut to a length of the wire probe 13 in the first cutting process (see FIG. 5A) without performing the cutting process of FIG. 5D. Alternatively, the cutting process (see FIG. 5D) may be performed following the polishing process (see FIG. 5B), and then the wear-resistant contact point film 31*b* may be formed (see FIG. 5C).

Then, the other end of the probe wire 42 that is not subjected to the polishing process is bent to form the L-shaped contact point 32. As described above, in Embodiment 1, the polishing may be performed only on the end of the wire material 41 (probe wire 42) on the first contact part 13*b* side, and the L-shaped contact point 32 is formed on the end on the second contact part 13*c* side, thereby enabling the polishing process to be simplified.

Thus, the probe wire 42 is completed.

A method of assembling the IC socket 12 is described with reference to FIGS. 6A-6C and FIGS. 7A-7B.

The upper side plate 14, the intermediate plate 15, the lower side plate 16, and the elastomer sheet 17 as described above are prepared. The elastomer sheet 17 is disposed on the lower side plate 16 by adhesion or the like. The upper side plate 14, the intermediate plate 15, the lower side plate 16, and the elastomer sheet 17 are laminated in order from below (i.e., in a reverse order to the laminating order when being used as illustrated in FIGS. 2A-2B. At this time, the insertion holes 14*a*, 15*a*, 16*a*, 17*a* are so positioned as to be aligned.

A mask plate 51 is disposed on the elastomer sheet 17. The mask plate 51 includes a plurality of grooves 52 corresponding to the insertion holes 14*a*, 15*a*, 16*a*, 17*a*, as illustrated FIG. 6A and FIG. 7A. Each of these grooves 52 is formed at a position and in a size capable of housing the L-shaped contact point 32 of the probe wire 42 therein.

Figure 6A:
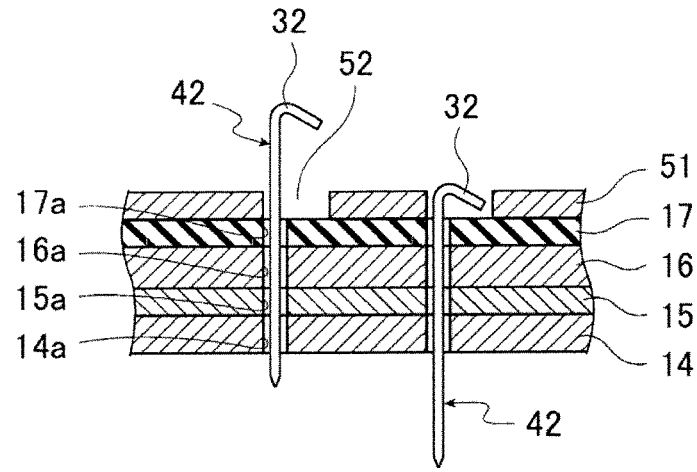
FIGS. 6A-6C are cross-sectional views each schematically illustrating a manufacturing process for the IC socket according to Embodiment 1 of the present invention.
Figure 7A:
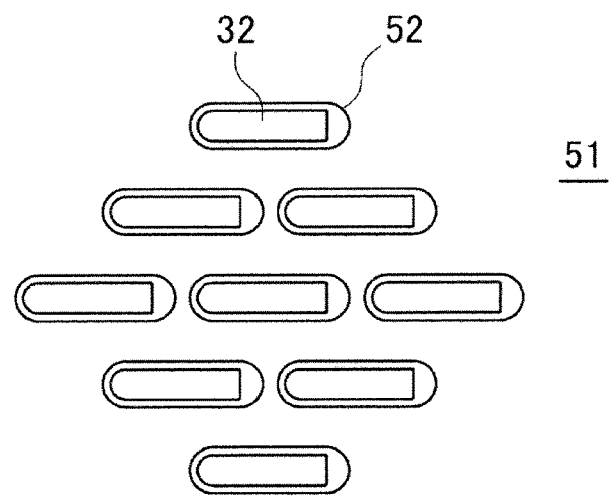
FIGS. 7A-7B are diagrams each schematically illustrating a manufacturing process of the IC socket according to Embodiment 1 of the present invention, where

As illustrated in FIG. 6A and FIG. 7A, the probe wire 42 as a "springy wire material" is inserted into the groove 52, and the insertion holes 14*a*, 15*a*, 16*a*, 17*a* from above the mask plate 51 while directing the L-shaped contact point 32 upward. At this time, the L-shaped contact point 32 is housed in the groove 52 in the mask plate 51. The L-shaped contact points 32 of the probe wires 42 are housed in the grooves 52, respectively while aligning the directions of the L-shaped contact points 32, thereby capable of preventing these L-shaped contact points 32 from being in contact with one another.

Figure 6B:
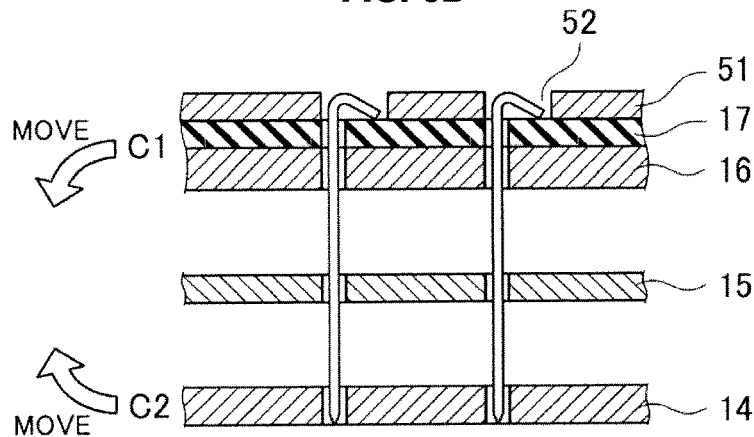
Figure 6C:
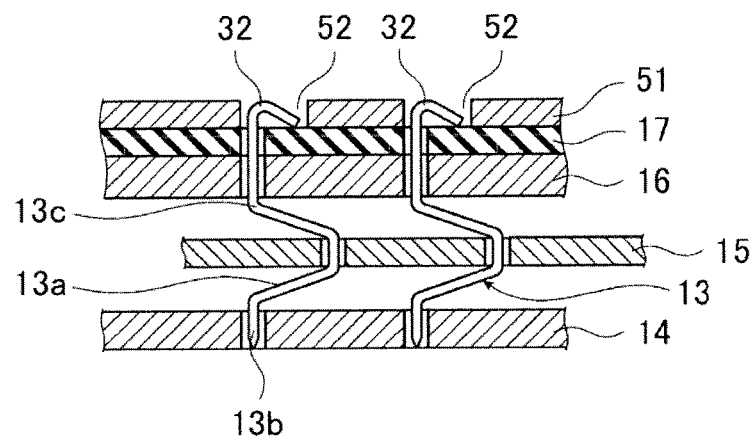
Figure 7B:
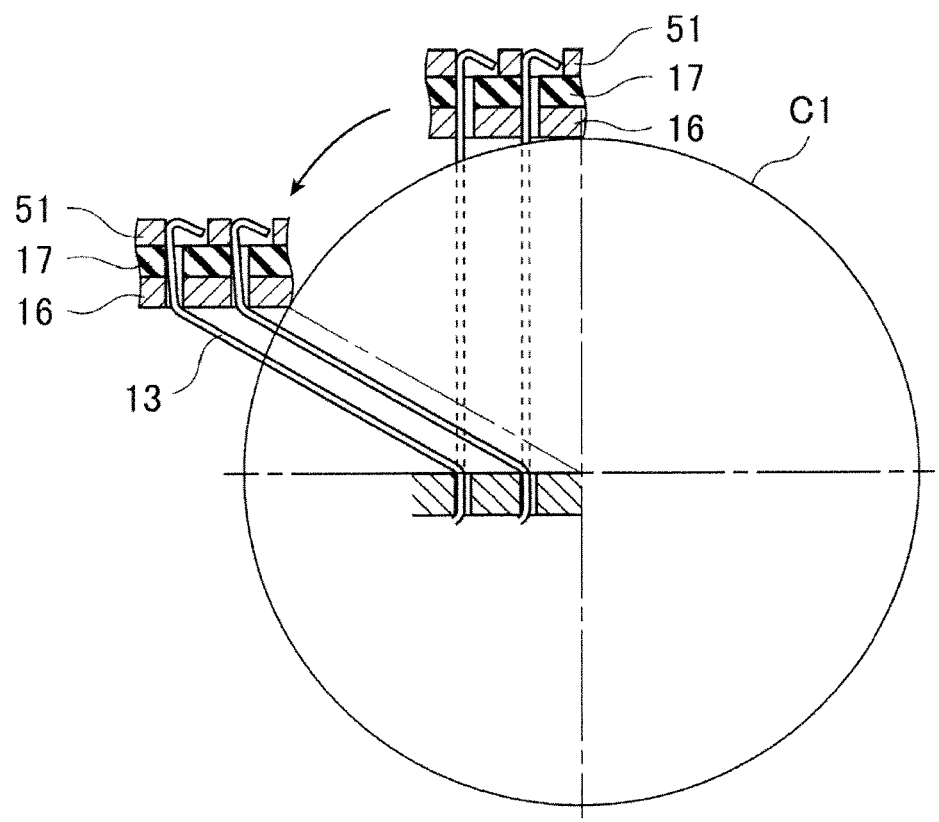

As illustrated in FIG. 6B, the upper side plate 14, the intermediate plate 15 and the lower side plate 16 are separated from one another. At this time, the intermediate plate 15 need not to be necessarily positioned at a center between the upper side plate 14 and the lower side plate 16, and may be displaced upwardly or downwardly from the center. As illustrated in FIG. 6B and FIG. 7B, the lower side plate 16 is moved in parallel along a first circumferential direction C1 in a state where the intermediate plate 15 is fixed by the fixing means (not illustrated). Similarly, the upper side plate 14 is also moved along a second circumferential direction C2 in the state where the intermediate plate 15 is fixed by the fixing means (see FIG. 6B). Then, as illustrated in FIG. 6C, the probe wire 42 is plastically deformed to be capable of simultaneously form the substantially "V"-shaped spring part 13*a*, the first contact part 13*b* that extends upwardly from the spring part 13*a* and the second contact part 13*c* that extends downwardly from the spring part 13*a*.

Note that in Embodiment 1, the lower side plate 16 and the upper side plate 14 are simultaneously moved in the circumferential directions, but may be separately moved in the circumferential directions.

Then, the mask plate 51 is removed from the elastomer sheet 17. The upper side plate 14 is vertically movably attached in the IC socket 12 using the support means (not illustrated), and the lower side plate 16 is fixed and attached, to complete the IC socket 12.

A method of using the IC socket 12 of such a configuration is described below.

The IC socket 12 is previously fixed on the wiring board 10 so that the lower side plate 16 of the IC socket 12 presses the elastomer sheet 17. As a result, the elastomer sheet 17 is elastically deformed. The bent portion 32*a* of the L-shaped contact point 32 is pressed to the wiring board 10 by a reaction force of the elastic deformation, thus making the second contact part 13*c* and the electrode 10*a* conductive.

The IC package 11 is carried by an automatic machine, guided by the guide part 21*a* of the housing member 21 (see FIG. 1B), and housed on the probe disposing region 22 of the upper side plate 14 (see FIG. 2A).

When the IC package 11 is pressed downwardly by pressing means (not illustrated), the upper side plate 14 is guided by guide pins 25 (see FIG. 1B) and moved downwardly against the biasing force of the support means (not illustrated). Then, the solder balls 11*a* of the IC package 11 each are brought into pressure-contact with the corresponding distal end portion 31 of the wire probe 13 at a predetermined contact pressure (see FIG. 2B). As a result, the solder ball 11*a* and the first contact part 13*b* of the wire probe 13 are made conductive. Note that when the upper side plate 14 is moved downwardly, the intermediate plate 15 is moved in parallel in the right downward direction illustrated in FIGS. 2A-2B.

After the IC package 11 is thus electrically connected to the wiring board 10 through the wire probe 13, a burn-in test or the like is performed.

As described above, according to Embodiment 1, the highly conductive film 33 is formed between the region for forming the wear-resistant contact point film 31*b* and the bent portion (distal end portion) 32*a* of the L-shaped contact point 32, thereby capable of making the electric resistance of the wire probe 13 sufficiently small.

The wear-resistant contact point film 31b is formed on the distal end portion 31 of the first contact part 13b, thereby preventing the contact area from being increased due to wear of the distal end portion 31. Even if the wire probe 13 is repeatedly used for a long period of time, the electric resistance can be maintained in a sufficiently low state.

As a result, Embodiment 1 can provide the IC socket 12 having excellent stability and reliability, and does not impair the stability and the reliability even if the IC socket 12 is repeatedly used for a long period of time.

In addition, according to Embodiment 1, the L-shaped contact point 32 of the wire probe 13 is pressed by a pressing force of the lower side plate 16 against the elastomer sheet 17, and the pressing force brings the wire probe 13 into contact with the electrode 10a of the wiring board 10, so that each wire probe 13 can be brought into contact with the electrode 10a of the wiring board 10 by the uniform pressing force.

In Embodiment 1, the first contact part 13b of the wire probe 13 is brought into contact with the solder ball 11a of the IC package 11 by the biasing force generated by the spring part 13a of the wire probe 13, and thereby the pressing force can be set to different values between on the first contact part 13b side and on the second contact part 13c side.

In Embodiment 1, the L-shaped contact point 32 is formed as a "pressure receiving portion" by bending the distal end portion of the second contact part 13c, thereby capable of easily forming the pressure receiving portion.

The highly conductive film 33 is formed on the wire material 41, one end of the wire material 41 is cut, and then the L-shaped contact point 32 is formed by bending the cut end in a substantially L-shape, and therefore the cut end is not required to be subjected to the surface treatment. According to Embodiment 1, the manufacturing process becomes simple, and therefore the IC socket 12 can be provided at a low cost.

Note that in Embodiment 1, the first contact part 13b is brought into contact with the solder ball 11a of the IC package 11 by the contact pressure generated by the spring part 13a, and the second contact part 13c is brought into contact with the electrode 10a of the wiring board 10 by the elastic reaction force of the elastomer sheet 17.

However, both of the first and second contact parts 13b, 13c may be brought into the solder balls 11a of the IC packages 11 by a contact pressure generated by the spring part 13a.

[Embodiment 2 of Invention]

FIG. 8 is a schematic cross-sectional view illustrating a main portion configuration of an IC socket 12 according to Embodiment 2 of the present invention.

The IC socket 12 according to Embodiment 2 differs from the IC socket 12 according to Embodiment 1 (see FIGS. 1A-1B, 2A-2B, 3A-3C, 4A-4B, 5A-5E, 6A-6C, 7A-7B) in a configuration of the first contact part provided in the wire probe 13. That is, in Embodiment 2, an elastomer sheet and the L-shaped contact point as a "pressure receiving portion" are provided to each of the first and second contact parts.

As illustrated in FIG. 8, a distal end portion of a first contact part 13b of a wire probe 13 is bent downwardly by 90 degrees or more to form an L-shaped contact point 34.

An elastomer sheet 18 is provided on an upper surface of an upper side plate 14. The elastomer sheet 18 is provided with insertion holes 18a as "sheet insertion holes." In addition, the first contact part 13b is inserted into the insertion hole 14a in the upper side plate 14 and the insertion hole 18a in the elastomer sheet 18. The elastomer sheet 18 is pressed by the upper side plate 14, and a bent portion 34a of the L-shaped contact point 34 is pressed to the solder ball 11a of the IC package 11 by a stress caused when the elastomer sheet 18 is elastically deformed by the pressing force of the upper side plate 14, thus making the first contact part 13b and the solder ball 11a conductive.

In Embodiment 2, the wire probe 13 can be brought into contact with the solder ball 11a of the IC package 11 at a predetermined pressing force without using the biasing force generated by the wire probe 13. Therefore, the pressing force of the first contact part 13b of each wire probe 13 can be made uniform. The pressing force can be also set to different values between on the first contact part 13b side and on the second contact part 13c side.

Similarly to Embodiment 1 described above, the first contact part 13b can be formed only by bending the distal end portion thereof, so that the processing of the distal end portion is not required, thereby capable of reducing the manufacturing cost of the IC socket 12.

Embodiments 1 and 2 have been described as an example where the present invention is applied to the IC socket 12 for the IC package 11, but the present invention can be also applied to the other type of electric component socket.

Embodiments 1 and 2 have been described as an example where the wire probe 13 is used as an electric contact, but the present invention can be also applied where the other type of electric contact such as a plate-spring-like electric contact is used.

REFERENCE SIGNS LIST 10 wiring board
10a electrode
11 IC package
11a solder ball
12 IC socket
13 wire probe
13a spring part
13b first contact part
13c second contact part
13e first spring region
13f second spring region
14 upper side plate
14a, 15a, 16a, 17a, 18a insertion hole
14b ball guide
15 intermediate plate
16 lower side plate
17, 18 elastomer sheet
21 housing member
22, 23, 24 probe disposing region
30 base material
31 distal end portion
31a spherical surface
31b wear-resistant contact point film
31c surface region
32, 34 L-shaped contact point
32a, 34a bent portion
33 highly conductive film
41 wire material
42 probe wire
42 wire
51 mask plate
52 groove

The invention claimed is:

1. An electric contact that electrically connects a first electrode provided in a first electric component and a second electrode provided in a second electric component, the electric contact comprising:
a base material that has a first contact part that is in contact with the first electrode of the first electric component, a second contact part that is in contact with the second electrode of the second electric component, and a spring part that brings the first contact part into contact with the first electrode of the first electric component by a predetermined contact pressure, wherein the base material is made from a springy wire material;
a wear-resistant contact point film that is formed only on a distal end portion of the first contact part on the springy wire material of the base material and has a higher wear resistance than the springy wire material of the base material; and
a highly conductive film that is formed on the springy wire material of the base material between a distal end portion of the second contact part and a region where the wear-resistant contact point film is formed and the highly conductive film has a smaller electric resistance than the springy wire material of the base material.

2. The electric contact according to claim 1, wherein a spherical surface having a radius of 2 μm or more and of 10 μm or less is formed in the distal end portion of the first contact part, and
the wear-resistant contact point film is formed on at least the spherical surface.

3. The electric contact according to claim 1, wherein the predetermined contact pressure is 5 grams or less.

4. The electric contact according to claim 1, wherein the wear-resistant contact point film is chemically inactive.

5. The electric contact according to claim 1, wherein the wear-resistant contact point film is a carbon film, or a ruthenium film, an iridium film, a gold film, a silver film, a palladium film, a rhodium film, or an alloy film of these metals.

6. The electric contact according to claim 1, wherein the highly conductive film is a silver film, a gold film, or copper-nickel laminated film.

7. An electric component socket, wherein the first electrode provided in the first electric component is electrically connected to the second electrode provided in the second electric component using the electric contact according to claim 1.

8. An electric component socket, comprising:
a plate;
a plurality of electric contacts each of which has a contact part that is inserted into a corresponding plate insertion hole of the plate, and is in contact with an electrode of an electric component; and
an elastomer sheet that is provided to the plate so as to face the electrode of the electric component, wherein
the elastomer sheet includes sheet insertion holes each to insert the electric contact therethrough,
the electric contact includes a pressure receiving portion that receives a pressing force of the elastomer sheet to bring the contact part into contact with the electrode of the electric component at a predetermined contact pressure, and
the elastomer sheet is elastically deformed to press the pressure receiving portion so that the electric contact is in contact with the electrode of the electric component by the pressing force.

9. The electric component socket according to claim 8, wherein
the pressure receiving portion is an L-shaped contact point formed by bending a distal end portion of the electric contact.

10. An electric component socket, comprising:
a first plate that houses a first electric component;
a second plate that is disposed to face a second electric component; and
a plurality of electric contacts each of which includes:
a first contact part that is inserted into a first insertion hole in the first plate to be in contact with a first electrode of the first electric component;
a second contact part that is inserted into a second insertion hole in the second plate to be in contact with a second electrode of the second electric component; and
a spring part that brings the first contact part into contact with the first electrode of the first electric component,
wherein
the first contact part of the electric contact is in contact with the first electrode of the first electric component by a contact pressure generated by the spring part,
the second plate includes an elastomer sheet provided to face the second electrode of the second electric component,
the elastomer sheet includes sheet insertion holes each to insert the electric contact therethrough,
the electric contact includes a pressure receiving portion that receives a pressing force of the elastomer sheet to bring the second contact part into contact with the electrode of the electric component at a predetermined contact pressure, and
the elastomer sheet is elastically deformed to press the pressure receiving portion so that the electric contact is in contact with the electrode of the electric component by the pressing force.

11. The electric component socket according to claim 10, wherein
the pressure receiving portion is an L-shaped contact point formed by bending a distal end portion of the second contact part.

12. The electric contact according to claim 1, wherein the distal end portion of the first contact part is formed to be tapered slenderer toward an end part of the distal end portion, and
the distal end portion of the second contact part has a L-shaped contact point formed by bending the distal end portion of the second contact part in a substantially L-shape.

13. The electric contact according to claim 1, wherein the distal end portion of the first contact part has a spherical surface at an end part of the distal end portion, and the wear-resistant contact point film is formed only on a region including the spherical surface of the distal end portion of the first contact part.

14. The electric contact according to claim 1, wherein at least one end of the springy wire material is cut after the conductive surface film is formed on the springy wire material, and then a L-shaped contact point is formed by bending the cut end in a substantially L-shape.

15. An electric component socket, comprising:
a first plate that houses a first electric component;
a second plate that is disposed to face a second electric component; and
an electric contact that includes:
  a first contact part that is inserted into a first insertion hole in the first plate to be in contact with a first electrode of the first electric component;
  a second contact part that is inserted into a second insertion hole in the second plate to be in contact with a second electrode of the second electric component; and
  a spring part that is provided between the first contact part and the second contact part,
wherein
  the electric contact is an electric contact that electrically connects a first electrode provided in the first electric component and a second electrode provided in the second electric component, the electric contact including:
    a base material that has,
      the first contact part that is in contact with the first electrode of the first electric component,
      the second contact part that is in contact with the second electrode of the second electric component, and
      the spring part that brings the first contact part into contact with the first electrode of the first electric component by a predetermined contact pressure, wherein the base material is made from a springy wire material;
    a wear-resistant contact point film that is formed only on a distal end portion of the first contact part on the springy wire material of the base material and has a higher wear resistance than the springy wire material of the base material; and
    a highly conductive film that is formed on the springy wire material of the base material between a distal end portion of the second contact part and a region where the wear-resistant contact point film is formed and the highly conductive film has a smaller electric resistance than the springy wire material of the base material,
  the first contact part of the electric contact is in contact with the first electrode of the first electric component by a contact pressure generated by the spring part, and
  the second contact part of the electric contact includes an L-shaped contact point formed by bending a distal end portion of the second contact part in a substantially L-shape so that a bent portion of the L-shaped contact point is in contact with the second electrode of the second electric component by being pressed by a contact pressure generated by the spring part.

16. The electric component socket according to claim 15, wherein
the electric contact is provided in which a conductive surface film is formed on a springy wire material, at least one end of the springy wire material is cut, and then the L-shaped contact point is formed by bending the cut end in a substantially L-shape.

17. An electric component socket, comprising:
a first plate that houses a first electric component;
a second plate that has elasticity and is disposed to face a second electric component; and
an electric contact that includes:
  a first contact part that is inserted into a first insertion hole in the first plate to be in contact with a first electrode of the first electric component;
  a second contact part that is inserted into a second insertion hole in the second plate to be in contact with a second electrode of the second electric component; and
  a spring part that is provided between the first contact part and the second contact part, wherein
the first contact part of the electric contact is in contact with the first electrode of the first electric component by a contact pressure generated by the spring part, and
the second contact part of the electric contact includes an L-shaped contact point formed by bending a distal end portion of the second contact part in a substantially L-shape so that a bent portion of the L-shaped contact point is in contact with the second electrode of the second electric component by being pressed by a pressing force followed by a deformation of the second plate.

18. The electric component socket according to claim 17, wherein
the electric contact is provided in which a conductive surface film is formed on a springy wire material, at least one end of the springy wire material is cut, and then the L-shaped contact point is formed by bending the cut end in a substantially L-shape.

19. The electric component socket according to claim 17, wherein the electric contact further comprises:
  a base material that has,
    the first contact part that is in contact with the first electrode of the first electric component,
    the second contact part that is in contact with the second electrode of the second electric component, and
    the spring part that brings the first contact part into contact with the first electrode of the first electric component by a predetermined contact pressure, wherein the base material is made from a springy wire material;
  a wear-resistant contact point film that is formed only on a distal end portion of the first contact part on the springy wire material of the base material and has a higher wear resistance than the springy wire material of the base material; and
  a highly conductive film that is formed on the springy wire material of the base material between a distal end portion of the second contact part and a region where the wear-resistant contact point film is formed and the highly conductive film has a smaller electric resistance than the springy wire material of the base material.

* * * * *

UNITED STATES PATENT AND TRADEMARK OFFICE
CERTIFICATE OF CORRECTION

PATENT NO. : 10,256,588 B2
APPLICATION NO. : 15/563297
DATED : April 9, 2019
INVENTOR(S) : Takahiro Oda Page 1 of 1

It is certified that error appears in the above-identified patent and that said Letters Patent is hereby corrected as shown below:

In Column 15, Line 28:
In Claim 2, before "10μm" delete "of"

Signed and Sealed this
Second Day of July, 2019

Andrei Iancu
*Director of the United States Patent and Trademark Office*